(12) United States Patent
Liang et al.

(10) Patent No.: US 7,405,166 B2
(45) Date of Patent: Jul. 29, 2008

(54) METHOD OF MANUFACTURING CHARGE STORAGE DEVICE

(75) Inventors: Chieh-Shuo Liang, Kaohsiung (TW);
Pei-Jer Tzeng, Jhonghe (TW);
Heng-Yuan Lee, Madou Township,
Tainan County (TW); Lurng-Shehng Lee, Chiudon Township, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 281 days.

(21) Appl. No.: 11/407,440

(22) Filed: Apr. 19, 2006

(65) Prior Publication Data
US 2007/0161185 A1     Jul. 12, 2007

(30) Foreign Application Priority Data
Jan. 10, 2006    (TW)    ................ 95100872 A

(51) Int. Cl.
*H01L 21/31*    (2006.01)
*H01L 29/792*    (2006.01)
(52) U.S. Cl. ................... 438/763; 257/325
(58) Field of Classification Search ....... 257/311–315, 257/325, 332, E29.309; 438/763, 785
See application file for complete search history.

(56) References Cited

U.S. PATENT DOCUMENTS

| 6,635,561 | B2 | 10/2003 | Kawai et al. ............... 438/622 |
| 6,706,591 | B1 | 3/2004 | Chan et al. ................ 438/255 |
| 2004/0004859 | A1* | 1/2004 | Forbes et al. .......... 365/185.05 |
| 2005/0199944 | A1* | 9/2005 | Chen et al. ................ 257/324 |

* cited by examiner

*Primary Examiner*—Calvin Lee
(74) *Attorney, Agent, or Firm*—J.C. Patents

(57) ABSTRACT

A method of manufacturing a charge storage device is provided. Utilizing the capacity for a precise control of the thickness and the silicon content of a deposited film in an atomic layer deposition process, a stacked gradual material layer such as a hafnium silicon oxide ($Hf_xSi_yO_z$) layer is formed. The silicon content is gradually changed throughout the duration of the $Hf_xSi_yO_z$ deposition process. The etching rate for the $Hf_xSi_yO_z$ layer in dilute hydrogen fluoride solution is dependent on the silicon content y in the $Hf_xSi_yO_z$ layer. The sidewalls of the stacked gradual material layer are etched to form an uneven profile. The lower electrode, the capacitor dielectric layer and the upper electrode are formed on the uneven sidewalls of the stacked gradual material layers, the area between the lower electrode and the upper electrode is increased to improve the capacitance of the charge storage device.

23 Claims, 4 Drawing Sheets

METHOD OF MANUFACTURING CHARGE STORAGE DEVICE

CROSS-REFERENCE TO RELATED APPLICATION

This application claims the priority benefit of Taiwan application serial no. 95100872, filed on Jan. 10, 2006. All disclosure of the Taiwan application is incorporated herein by reference.

BACKGROUND OF THE INVENTION

1. Field of the Invention

The present invention relates to a method of manufacturing a semiconductor device. More particularly, the present invention relates to a method of manufacturing a charge storage device.

2. Description of the Related Art

As the techniques for manufacturing deep sub-micron semiconductor devices start to mature, the size of each device is reduced correspondingly. Hence, for a dynamic random access memory, the area assigned to each memory cell for disposing the capacitor has become smaller and smaller. On the other hand, with the increasing demand for a larger storage space for computer application software, memory with an ever-increasing storage capacity is required. As the conflicting demands for a smaller device dimension but a higher memory storage capacity continue, a modification of the existing method of fabricating the dynamic random access memory is urgently needed before all the constraints dictated by the trend can be met.

In general, a number of ways is available for increasing the charge storage capacity of a capacitor. For example, the area of the capacity can be increased or a capacitor dielectric layer with a higher dielectric constant can be used so that the quantity of electric charges stored inside the capacitor is increased. Hence, a metal-insulator-metal (MIM) structure with a high dielectric constant (high k) insulation layer may become the mainstream DRAM capacitor in the next generation. Although using a metal electrode has the advantage of a lower dielectric response, but increasing the surface area of the metal electrode is not so easy. As a result, an innovative storage capacitor structure and manufacturing method thereof capable of maintaining a definite capacitance despite a reduction in the area occupied by the storage capacitor is researched so that the semiconductor devices can have a higher level of integration.

SUMMARY OF THE INVENTION

Accordingly, at least one objective of the present invention is to provide a method of manufacturing a charge storage device capable of increasing the lower electrode area of the charge storage device.

At least another objective of the present invention is to provide a method of manufacturing a charge storage device capable of simplifying the production process and miniaturize the device.

To achieve these and other advantages and in accordance with the purpose of the invention, as embodied and broadly described herein, the invention provides a method of manufacturing a charge storage device that includes the following steps. First, a substrate is provided. Then, a stacked insulation layer is formed over the substrate. The stacked insulation layer includes a plurality of gradual material layers. The material constituting the stacked insulation layer is represented by a chemical formula such as $b_y c_z$ or $a_x b_y c_z$, wherein a, b, c represents different elements while x, y, z represents the percentages of different atomic elements such that $x+y+z=100\%$. From the bottom to the top, the y value of the gradual material layer changes gradually even though the sum $x+y+z$ remains a fixed constant at 100%. Then, a mask layer is formed over the stacked insulation layer. Thereafter, the mask layer and the stacked insulation layer are patterned to form an opening that exposes the substrate. After that, an etching process is performed so that an irregular profile is formed on the exposed sidewalls of the stacked insulation layer.

In the aforementioned method of manufacturing the charge storage device, before forming the stacked insulation layer on the substrate, a liner layer is formed over the substrate. The material of the liner layer is silicon oxide formed, for example, by performing a plasma-assisted chemical vapor deposition process.

In the aforementioned method of manufacturing the charge storage device, the process of forming the stacked insulation layer over the substrate includes performing a chemical vapor deposition process, an atomic layer deposition process or a plasma-assisted atomic layer deposition process, for example. The stacked insulation layer is fabricated using silicon oxide ($Si_y O_z$), silicon nitride ($Si_y N_z$), hafnium silicon oxide ($Hf_x Si_y O_z$) or zirconium silicon oxide ($Zr_x Si_y O_z$), for example.

In the aforementioned method of manufacturing the charge storage device, the etching process is a wet etching process, for example.

In the aforementioned method of manufacturing the charge storage device, the mask layer and the stacked insulation layer are fabricated using materials having different etching selectivity.

The aforementioned method of manufacturing the charge storage device may further includes forming a lower electrode, a capacitor dielectric layer and an upper electrode on the sidewalls of the stacked insulation layer exposed by the opening and over the substrate.

In the aforementioned method of manufacturing the charge storage device, the capacitor dielectric layer is fabricated using a dielectric material having a dielectric constant equal to and greater than 4. The capacitor dielectric layer is fabricated using tantalum oxide ($Ta_2 O_5$), aluminum oxide ($Al_2 O_3$), hafnium oxide ($HfO_2$) or titanium oxide ($TiO_2$), for example. The method of forming the capacitor dielectric layer includes performing a chemical vapor deposition process, an atomic layer deposition process or a plasma-enhanced atomic layer deposition process, for example.

In the aforementioned method of manufacturing the charge storage device, the steps for fabricating the stacked insulation layer over the substrate include the following steps. In step (1), a substrate is placed inside the reaction chamber of an atomic layer deposition station. In step (2), after a metal-containing precursor is introduced into the reaction chamber, the excess metal-containing precursor is purged. In step (3), after an oxidizing agent is introduced into the reaction chamber, the excess oxidizing agent is purged. In step (4), after a silicon-containing precursor is introduced into the reaction chamber, the excess silicon-containing precursor is purged. In step (5), after an oxidizing agent is introduced into the reaction chamber, the excess oxidizing agent is purged. In step (6), the steps from (2) to (5) are repeated to form the stacked insulation layer. When the steps from (2) to (5) are repeated, the pulse ratio between the metal-containing precursor and the silicon-containing precursor is cyclically changed.

The present invention also provides an alternative method of manufacturing a charge storage device that includes the following steps. First, a substrate is provided. Then, an atomic layer deposition process is performed to form a stacked insulation layer over the substrate. The stacked insulation layer includes a plurality of gradual material layers. The gradual material layer is fabricated using hafnium silicon oxide ($Hf_xSi_yO_z$). In the various gradual material layers, the value of y changes gradually from the bottom to the top. After forming a mask layer over the stacked insulation layer, the mask layer and the stacked insulation layer are patterned to form an opening that exposes the substrate. After that, an etching process is performed so that an irregular profile is formed on the exposed sidewall of the stacked insulation layer.

In the aforementioned method of manufacturing the charge storage device, before forming the stacked insulation layer over the substrate, a liner layer is further formed over the substrate.

In the aforementioned method of manufacturing the charge storage device, the etching process is a wet etching process. Furthermore, the etching process is performed by using dilute hydrofluoric acid solution as the etching agent.

In the aforementioned method of manufacturing the charge storage device, the mask layer and the stacked insulation layer are fabricated using materials having different etching selectivity.

The aforementioned method of manufacturing the charge storage device may include sequentially forming a lower electrode, a capacitor dielectric layer and an upper electrode on the sidewalls of the stacked insulation layer exposed through the opening and over the substrate.

In the aforementioned method of manufacturing the charge storage device, the capacitor dielectric layer is fabricated using a dielectric material having a dielectric constant equal to and greater than 4. The capacitor dielectric layer is fabricated using tantalum oxide ($Ta_2O_5$), aluminum oxide ($Al_2O_3$), hafnium oxide ($HfO_2$) or titanium oxide ($TiO_2$).

In the aforementioned method of manufacturing the charge storage device, the process of forming the capacitor dielectric layer includes performing a chemical vapor deposition process, an atomic layer deposition process or a plasma-assisted atomic layer deposition process.

In the aforementioned method of manufacturing the charge storage device, the steps for fabricating the stacked insulation layer over the substrate by performing the atomic layer deposition process includes the following steps. In step (1), a substrate is placed inside a reaction chamber. In step (2), after hafnium tetrachloride ($HfCl_4$) is introduced into the reaction chamber, the excess $HfCl_4$ is purged. In step (3), after water ($H_2O$) is introduced into the reaction chamber, the excess $H_2O$ is purged. In step (4), after silicon tetrachloride ($SiCl_4$) is introduced into the reaction chamber, the excess $SiCl_4$ is purged. In step (5), after $H_2O$ is introduced into the reaction chamber, the excess $H_2O$ is purged. In step (6), the steps from (2) to (5) are repeated to form the stacked insulation layer. When the steps from (2) to (5) are repeated, the pulse ratio between the $HfCl_4$ and the $SiCl_4$ is cyclically changed.

In the method of manufacturing a charge storage device according to the present invention, the capacity of an atomic layer deposition process for a precise control of the thickness and material composition of a deposited film is utilized to form a gradually-changed stacked insulation layer. Then, using the difference in etching rates as a result of the gradual change in the material composition, the etched sidewalls of the stacked insulation layer can have an uneven profile. Ultimately, the charge storage device formed on the gradual stacked insulation layer can have a larger charge storage capacity.

Furthermore, all the steps for manufacturing the charge storage device according to the present invention are performed inside a single reaction chamber. By adjusting the composition of the precursor material (the reactive gases) or the reaction time, the required stacked insulation layer (the gradual material layer) is formed. Therefore, the manufacturing process is simplified and the production cost is reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
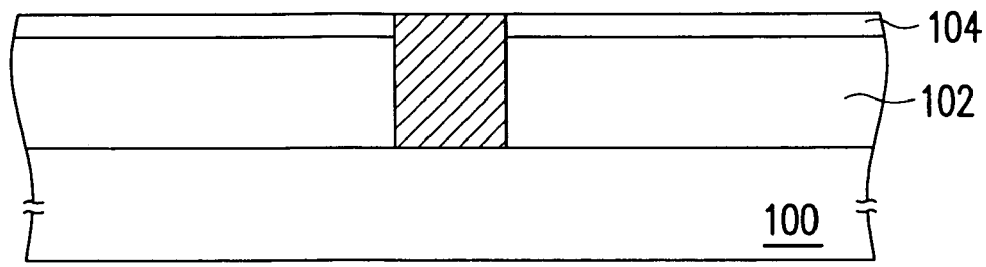
FIGS. 1A to 1F are schematic cross-sectional views showing the steps for forming a charge storage device according to the present invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1F are schematic cross-sectional views showing the steps for forming a charge storage device according to the present invention. FIG. 2 is a graph showing the relation between the ratio of silicon in the $Hf_xSi_yO_z$ and the thickness of the gradual material layer and the relation between the etching rate and the thickness of the gradual material layer.

Figure 2:
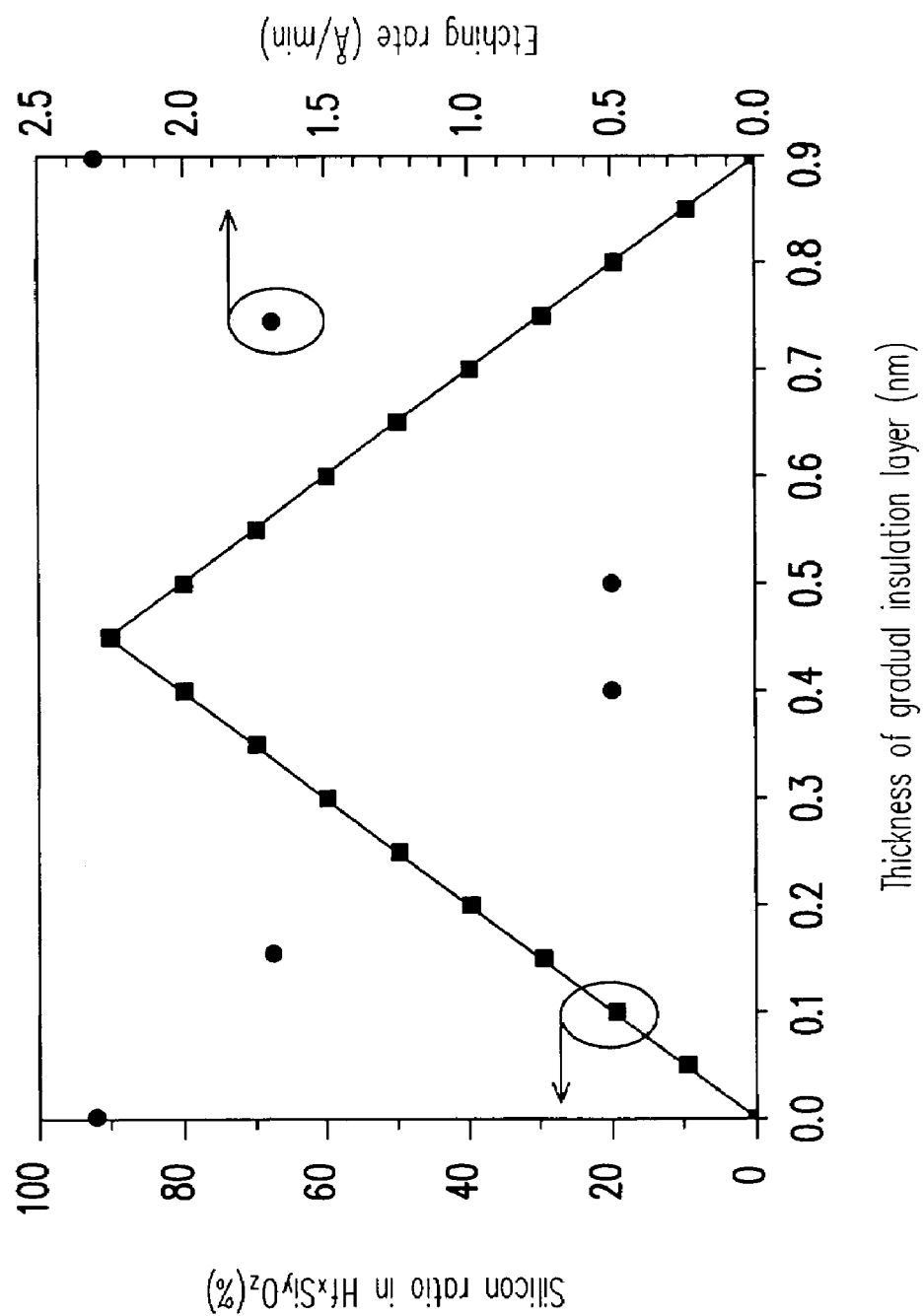
FIG. 2 is a graph showing the relation between the ratio of silicon in the $Hf_xSi_yO_z$ and the thickness of the gradual material layer and the relation between the etching rate and the thickness of the gradual material layer.

First, as shown in FIG. 1A, a substrate 100 is provided. The substrate 100 is a silicon substrate (for a simpler view, the device within the substrate 100 are not shown), for example. Then, an insulation layer 102 and a cap layer 104 are formed on the substrate 100. The insulation layer 102 is fabricated using silicon oxide, for example. The method of forming the insulation layer 102 includes performing a plasma-enhanced chemical vapor deposition (PECVD) process using tetraethyl-ortho-silicate (TEOS)/ozone ($O_3$) as the reactive gas, for example. Obviously, the insulation layer 102 can be fabricated using other commonly used insulating material in semiconductor production processes. The cap layer 104 is fabricated using a material having an etching selectivity different from the insulation layer 102, for example, silicon nitride or silicon oxynitride. The method of forming the cap layer 104 includes performing a plasma-enhanced chemical vapor deposition process, for example.

Thereafter, a plug 106 is formed in the cap layer 104 and the insulation layer 102. The plug 106 is fabricated using a conductive material including, for example, copper, aluminum, tungsten or nickel. The method of forming the plug 106 includes, for example, forming an opening in the cap layer 104 and the insulation layer 102, depositing conductive material over the substrate 100 to form a conductive layer, and finally removing the conductive layer outside the opening.

Figure 1B:
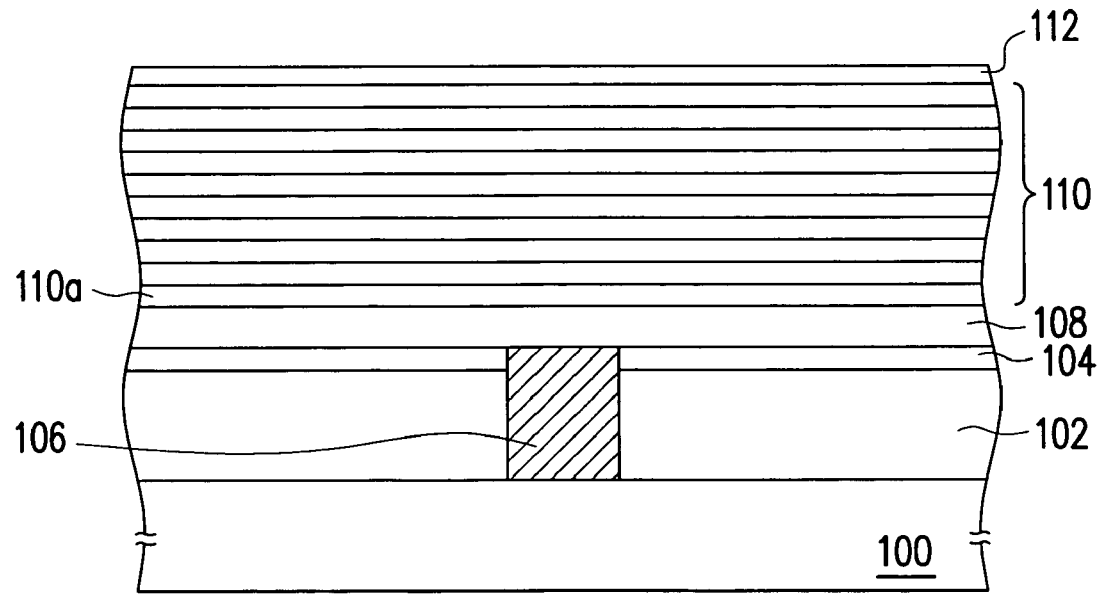

As shown in FIG. 1B, a liner layer 108 is formed on the substrate 100. The liner layer 108 is fabricated using silicon oxide, for example. The method of forming the liner layer 108 includes performing a plasma-assisted chemical vapor deposition, for example. Obviously, the liner layer 108 is optional so that whether the liner layer 108 is formed or not depends on the actual need.

Thereafter, a stacked insulation layer 110 is formed over the substrate 100. The stacked insulation layer 110 includes a plurality of gradual material layers 110a, for example. The material constituting the gradual material layers 110a can be represented by a chemical formula such as $b_y c_z$ or $a_x b_y c_z$, wherein a, b, c represents different elements while x, y, z represents the percentages of different atomic elements such that x+y+z=100%. In the present invention, the so-called gradual material layer is a continuous film layer whose material composition gradually changes according to position. For example, in the present embodiment, if the general formula for the gradual material layers 110a is represented by $b_y c_z$, from the bottom to the top of each gradual material layer 110a, the y value rises gradually to a larger value before returning to a smaller value or vice versa. On the other hand, if the general formula for the gradual material layers 110a is represented by $a_x b_y c_z$, from the bottom to the top of each gradual material layers 110a, the y value rises gradually to a larger value before returning to a smaller value or vice versa. However, the value of the sum x+y+z is at a fixed value of 100%. The stacked insulation layer 110 is fabricated using silicon oxide ($Si_y O_z$), silicon nitride ($Si_y N_z$), hafnium silicon oxide ($Hf_x Si_y O_z$) or zirconium silicon oxide ($Zr_x Si_y O_z$), for example. Obviously, in the composition of the gradual material layers 110a, only the value of y requires a gradual change. There are no particular rules that stipulate the value of y has to increase before decreasing or decrease before increasing.

In the following, using hafnium silicon oxide ($Hf_x Si_y O_z$) as an example of the material constituting the gradual material layers, the steps for forming the stacked insulation layer 110 using an atomic layer deposition method is described in more detail.

In step (1), after the liner layer 108 is formed, the substrate 100 is placed inside the reaction chamber of an atomic layer deposition station.

In step (2), hafnium tetrachloride ($HfCl_4$) is introduced into the reaction chamber to serve as a metal-containing precursor. The hafnium tetrachloride ($HfCl_4$) and the liner layer 108 react to form Si—O—$HfCl_3$. Thereafter, a purging process is carried out. In other words, an inert gas such as helium, neon, argon, krypton, xenon, radon or nitrogen is introduced into the reaction chamber to remove the excess hafnium tetrachloride ($HfCl_4$).

In step (3), water ($H_2O$) is introduced into the reaction chamber to serve as an oxidizing agent for converting the Si—O—$HfCl_3$ into Si—O—$Hf(OH)_3$. Then, a purging process is carried out. In other words, an inert gas such as helium, neon, argon, krypton, xenon, radon or nitrogen is introduced into the reaction chamber to remove the excess water ($H_2O$).

In step (4), silicon tetrachloride ($SiCl_4$) is introduced into the reaction chamber to serve as a silicon-containing precursor. Then, a purging process is carried out. In other words, an inert gas such as helium, neon, argon, krypton, xenon, radon or nitrogen is introduced into the reaction chamber to remove the excess silicon tetrachloride ($SiCl_4$).

In step (5), water ($H_2O$) is introduced into the reaction chamber to serve as an oxidizing agent. Then, a purging process is carried out. In other words, an inert gas such as helium, neon, argon, krypton, xenon, radon or nitrogen is introduced into the reaction chamber to remove the excess water ($H_2O$).

In the aforementioned steps, step (1) to (5) is defined as a cycle. By repeating the foregoing cycles a plurality of times, a layer of gradual material layers 110a is formed. For example, shown by the symbol □ in FIG. 2, a gradual material layer 110a with a thickness of about 0.9 nm is formed after 19 cycles. In the first cycle, the amount of silicon tetrachloride ($SiCl_4$) precursor introduced into the reaction chamber is zero so that a hafnium oxide ($HfO_2$) layer with a thickness of about 0.05 nm is formed. Then, the second to the tenth cycle are carried out such that the amount of silicon tetrachloride ($SiCl_4$) precursor introduced into the reaction chamber is gradually increased. Hence, the silicon content within the hafnium silicon oxide ($Hf_x Si_y O_z$) gradually increases. Thereafter, the eleventh to the nineteenth cycle are carried out such that the amount of silicon tetrachloride ($SiCl_4$) precursor introduced into the reaction chamber is gradually reduced. Thus, the silicon content within the hafnium silicon oxide ($Hf_x Si_y O_z$) gradually decreases. As a result, a gradual material layer 110a whose composition of silicon (the y value) increases and then decreases from the bottom to the top of the layer is produced. Then, the foregoing process is repeated to form the stacked insulation layer 110 having a plurality of gradual material layers 110a. More specifically, the steps for forming a plurality of gradual material layers 110a is a continuous process so that the whole process of forming the stacked insulation layer 110 can be achieved through adjusting the pulse ratio between $HfCl_4$ and the $SiCl_4$.

Figure 1C:
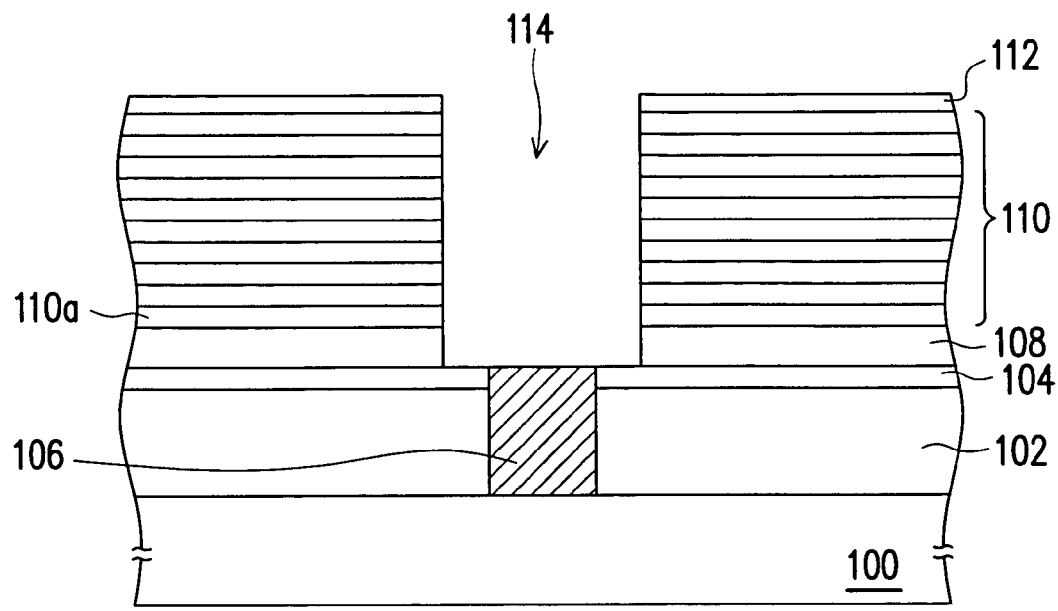

As shown in FIG. 1C, the mask layer 112 and the stacked insulation layer 110 are patterned to form an opening 114 that exposes the substrate 100. The opening 114 needs to expose at last the plug 106. The method of patterning the mask layer 112 and the stacked insulation layer 110 includes performing a photolithographic and etching process, for example. Furthermore, in the process of etching the mask layer 112 and the stacked insulation layer 110, the cap layer 104 can serve as an etching stop layer that prevents possible damage to the plug 106 through over-etching.

Figure 1D:
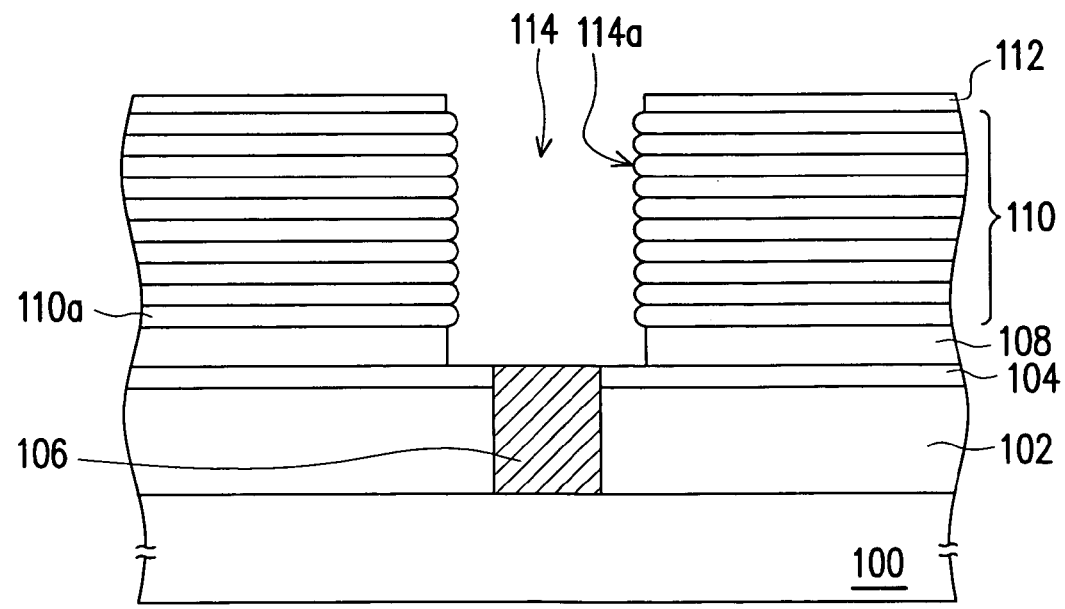

As shown in FIG. 1D, an etching process is carried out so that an irregular profile is formed on the sidewalls of the stacked insulation layer 110 exposed through the opening 140. The etching process is a wet etching process, for example. Because the material composing the stacked insulation layer shows periodic variations, the etching agent acting on the material layer also shows periodic variations. Therefore, after the etching process, an irregular pattern or a wavy profile will appear on the sidewalls 114a of the stacked insulation layer 110.

For example, if the gradual material layer is fabricated from hafnium silicon oxide ($Hf_x Si_y O_z$) and the etching agent is diluted hydrofluoric acid (0.01%) solution, as shown by the symbol ○ in FIG. 2, the greater the amount of silicon in the hafnium silicon oxide, the smaller will be the etching rate of the diluted hydrofluoric acid solution on the hafnium silicon oxide layer. Conversely, the smaller the amount of silicon in the hafnium silicon oxide, the greater will be the etching rate of the diluted hydrofluoric acid solution on the hafnium silicon oxide layer.

Figure 1E:
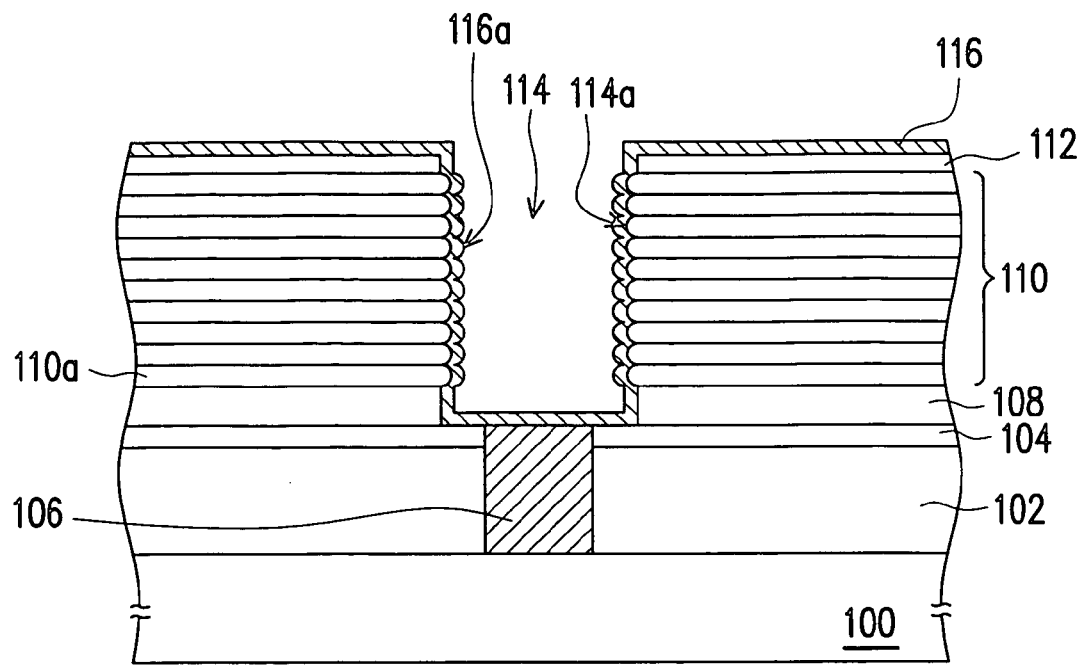

As shown in FIG. 1E, a conductive layer 116 is formed over the substrate 100. The conductive layer 116 is fabricated using a metal such as copper, aluminum, tungsten and nickel, for example. The conductive layer 116 is formed, for example, by performing a chemical vapor deposition process, an atomic layer deposition process, a plasma-assisted atomic layer deposition process. Furthermore, the conductive layer 116a on the sidewalls of the stacked insulation layer 110 exposed by the opening 114 has an irregular surface or a wavy profile.

Figure 1F:
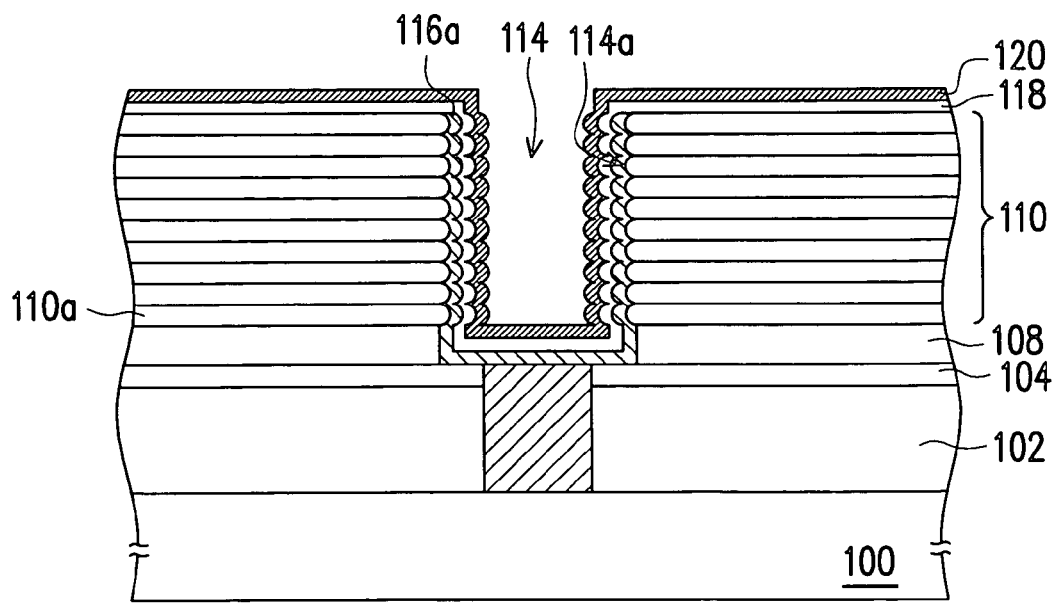

As shown in FIG. 1F, the conductive layer 116 and the mask layer 112 outside the opening 114 is removed to retain only the conductive layer 116a on the sidewalls 114a of the opening 114. The method of removing the conductive layer 116 and the mask layer 112 outside the opening 114 includes, for example, performing a chemical-mechanical polishing operation. In the process of removing the conductive layer 116 and the mask layer 112 outside the opening 114, the stacked insulation layer 110 is used as a polishing stop layer. The conductive layer 116a serves as the lower electrode of a charge storage device.

Thereafter, a capacitor dielectric layer 118 is formed over the substrate 100. The capacitor dielectric layer 118 is fabricated using a high dielectric constant material with a dielectric constant equal to and greater than 4 such as tantalum oxide ($Ta_2O_5$), aluminum oxide ($Al_2O_3$), hafnium oxide ($HfO_2$) or titanium oxide ($TiO_2$), for example. The method of forming the capacitor dielectric layer 118 includes performing a chemical vapor deposition process, an atomic layer deposition process or a plasma-assisted atomic layer deposition process, for example. The capacitor dielectric layer 118 on the sidewalls of the stacked insulation layer 110 exposed by the opening 114 also has an irregular surface or a wavy profile.

After that, a conductive layer 120 is formed over the capacitor dielectric layer 118. The conductive layer 120 is fabricated using a metal such as copper, aluminum, tungsten or nickel, for example. The method of forming the conductive layer 120 includes performing a chemical vapor deposition process, an atomic layer deposition process or a plasma-assisted atomic layer deposition process, for example. The conductive layer 120 on the sidewalls of the stacked insulation layer 110 exposed by the opening 114 also has an irregular surface or a wavy profile. The conductive layer 120 serves as the upper electrode of the charge storage device.

In the aforementioned embodiment, the precise control of the thickness and silicon content of an atomic layer deposition method is utilized to deposit a hafnium silicon oxide ($Hf_xSi_yO_z$) layer. The amount of silicon in the $Hf_xSi_yO_z$ is varied in the deposition process so that a stacked insulation layer 110 (the gradual material layers 110a) is easily produced. Using the relation between the etching capacity of diluted hydrofluoric acid solution with respect to the silicon content within the $Hf_xSi_yO_z$ layer, an irregular profile is formed on the sidewalls of the stacked insulation layer 110 (the gradual material layer 110a) after etching with diluted hydrofluoric acid solution. Since the conductive layer 116a (the lower electrode), the capacitor dielectric layer 118, the conductive layer 120 (the upper electrode) are formed on the irregular sidewalls 114 of the stacked insulation layer 110, the overlapping area between the conductive layer 116a and the conductive layer 120 is increased. Ultimately, the charge storage capacitor of the charge storage device is also increased.

In summary, all the steps necessary for manufacturing the charge storage device according to the present invention can be carried out inside a single reaction chamber. By adjusting the composition of the precursor material (the reactive gases) or the reaction time, the required stacked insulation layer (the gradual material layer) is formed. Therefore, the manufacturing process is simplified.

Furthermore, the capacity of an atomic layer deposition process for a precise control of the thickness and material composition of a deposited film and the change in etching rate resulting from a change in material composition are utilized in the present invention to form an irregular pattern or wavy profile on the sidewalls of the stacked insulation layer. The method is easy to perform so that the production cost can be reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a charge storage device, comprising the steps of:
   providing a substrate;
   forming a stacked insulation layer over the substrate, wherein the stacked insulation layer comprises a plurality of gradual material layers having a general formula $b_yc_z$ or $a_xb_yc_z$, a, b, c represents different elements and the value of y changes from the bottom to the top of each gradual material layer, however, the value of the sum x+y+z remains fixed at 100%;
   forming a mask layer over the stacked insulation layer;
   patterning the mask layer and the stacked insulation layer to form an opening that exposes the substrate;
   performing an etching process to form an irregular pattern on the sidewalls of the opening; and
   forming a lower electrode on the sidewalls of the opening and over the substrate.

2. The method of claim 1, wherein before the step of forming the stacked insulation layer over the substrate, further comprises forming a liner layer over the substrate.

3. The method of claim 1, wherein the material of the liner layer comprises silicon oxide.

4. The method of claim 1, wherein the step for forming the liner layer comprises performing a plasma-assisted chemical vapor deposition process.

5. The method of claim 1, wherein the step for forming the stacked insulation layer over the substrate comprises performing a chemical vapor deposition process, an atomic layer deposition process or a plasma-assisted atomic layer deposition process.

6. The method of claim 1, wherein the general formula for the stacked insulation layer is selected from a group consisting of silicon oxide with the general formula $Si_yO_z$, silicon nitride with the general formula $Si_yN_z$, hafnium silicon oxide with the general formula $Hf_xSi_yO_z$, and zirconium silicon oxide with the general formula $Zr_xSi_yO_z$.

7. The method of claim 1, wherein the etching process comprises a wet etching process.

8. The method of claim 1, wherein the mask layer and the stacked insulation layer are fabricated using materials having different etching selectivity.

9. The method of claim 1, wherein the steps for forming the stacked insulation layer over the substrate comprise:
   (1) placing the substrate inside the reaction chamber of an atomic layer deposition station;
   (2) introducing a metal-containing precursor into the reaction chamber and removing the excess metal-containing precursor thereafter;
   (3) introducing an oxidizing agent into the reaction chamber and removing the excess oxidizing agent thereafter;
   (4) introducing silicon-containing precursor into the reaction chamber and removing the excess silicon-containing precursor thereafter;

(5) introducing an oxidizing agent into the reaction chamber and removing the excess oxidizing agent thereafter;

(6) repeating the steps from step (2) to step (5) to form the stacked insulation layer, wherein the pulse ratio between the metal-containing precursor and the silicon-containing precursor are changed cyclically while repeating the steps from (2) to step (5).

10. The method of claim 1, wherein the steps for manufacturing the charge storage device further comprise:

forming a capacitor dielectric layer over the lower electrode, and forming an upper electrode over the capacitor dielectric layer.

11. The method of claim 10, wherein the capacitor dielectric layer is fabricated using a dielectric material having a dielectric constant equal to and greater than 4.

12. The method of claim 11, wherein the material constituting the capacitor dielectric layer is selected from a group consisting of tantalum oxide ($Ta_2O_5$), aluminum oxide ($Al_2O_3$), hafnium oxide ($HfO_2$) and titanium oxide ($TiO_2$).

13. The method of claim 10, wherein the step for forming the capacitor dielectric layer over the lower electrode comprises performing a chemical vapor deposition process, an atomic layer deposition process or a plasma-assisted atomic layer deposition process.

14. A method of manufacturing a charge storage device, comprising the steps of:

providing a substrate;

forming a stacked insulation layer over the substrate, wherein the stacked insulation layer comprises a plurality of gradual material layers fabricated using hafnium silicon oxide with a general formula $Hf_xSi_yO_z$ such that the value of y changes from the bottom to the top of each gradual material layer;

forming a mask layer over the stacked insulation layer;

patterning the mask layer and the stacked insulation layer to form an opening that exposes the substrate;

performing an etching process to form an irregular pattern on the sidewalls of stacked insulation layer exposed by the opening; and forming a lower electrode on the sidewalls of the stacked insulation layer exposed by the opening and over the substrate.

15. The method of claim 14, wherein before the step of forming the stacked insulation layer over the substrate, further comprises forming a liner layer over the substrate.

16. The method of claim 14, wherein the etching process comprises a wet etching process.

17. The method of claim 14, wherein the etching agent used in the etching process comprises a diluted hydrofluoric acid solution.

18. The method of claim 14, wherein the mask layer and the stacked insulation layer are fabricated using material having different etching selectivity.

19. The method of claim 14, wherein the steps for forming the stacked insulation layer over the substrate in an atomic layer deposition process comprise:

(1) placing the substrate inside the reaction chamber of an atomic layer deposition station;

(2) introducing hafnium tetrachloride ($HfCl_4$) into the reaction chamber and removing the excess hafnium tetrachloride ($HfCl_4$) thereafter;

(3) introducing water ($H_2O$) into the reaction chamber and removing the excess water ($H_2O$ thereafter;

(4) introducing silicon tetrachloride ($SiCl_4$) into the reaction chamber and removing the excess silicon tetrachloride ($SiCl_4$) thereafter;

(5) introducing water ($H_2O$) into the reaction chamber and removing the excess water ($H_2O$) thereafter;

(6) repeating the steps from step (2) to step (5) to form the stacked insulation layer, wherein the pulse ratio between the hafnium tetrachloride ($HfCl_4$) and the silicon tetrachloride ($SiCl_4$) are changed cyclically while repeating the steps from (2) to step (5).

20. The method of claim 14, wherein the steps for manufacturing the charge storage device further comprise:

forming a capacitor dielectric layer over the lower electrode; and forming an upper electrode over the capacitor dielectric layer.

21. The method of claim 20, wherein the capacitor dielectric layer is fabricated using a dielectric material having a dielectric constant equal to and greater than 4.

22. The method of claim 21, wherein the material constituting the capacitor dielectric layer is selected from a group consisting of tantalum oxide ($Ta_2O_5$), aluminum oxide ($Al_2O_3$), hafnium oxide ($HfO_2$) and titanium oxide ($TiO_2$).

23. The method of claim 20, wherein the step for forming the capacitor dielectric layer over the lower electrode comprises performing a chemical vapor deposition process, an atomic layer deposition process or a plasma-assisted atomic layer deposition process.

* * * * *